(12) United States Patent
Iino

(10) Patent No.: US 9,559,083 B2
(45) Date of Patent: Jan. 31, 2017

(54) SEMICONDUCTOR LIGHT-EMITTING DEVICE

(71) Applicants: CITIZEN ELECTRONICS CO., LTD., Yamanashi (JP); CITIZEN HOLDINGS CO., LTD., Tokyo (JP)

(72) Inventor: Takashi Iino, Yamanashi (JP)

(73) Assignees: CITIZEN ELECTRONICS CO., LTD., Yamanashi (JP); CITIZEN HOLDINGS CO., LTD., Tokyo (JP)

( * ) Notice: Subject to any disclaimer, the term of this patent is extended or adjusted under 35 U.S.C. 154(b) by 188 days.

(21) Appl. No.: 14/499,174

(22) Filed: Sep. 27, 2014

(65) Prior Publication Data

US 2015/0129907 A1    May 14, 2015

(30) Foreign Application Priority Data

Oct. 1, 2013 (JP) .................... 2013-206057

(51) Int. Cl.
*H01L 29/20* (2006.01)
*H01L 25/075* (2006.01)
(Continued)

(52) U.S. Cl.
CPC ........... *H01L 25/0753* (2013.01); *F21K 9/232* (2016.08); *F21V 3/0436* (2013.01);
(Continued)

(58) Field of Classification Search
CPC .............. H01L 2924/0002; H01L 2924/00; H01L 25/0753; H01L 33/504; H01L 33/62; H01L 33/486; H01L 33/501; H01L 33/502; H01L 33/503; H01L 33/505; H01L 33/506; H01L 33/507; H01L 33/508; H01L 33/54; H01L 25/0756; H01L 27/15–27/156; F21K 9/135; F21V 3/0436; F21V 23/06; F21V 23/003; F21V 23/004; F21V 23/005; F21V 23/006; F21V 9/00; F21Y 2101/02; H01J 1/62
(Continued)

(56) References Cited

U.S. PATENT DOCUMENTS 6,841,802 B2 * 1/2005 Yoo .................. H01L 33/44
                                                     257/81
8,319,320 B2 * 11/2012 Inoue ................ F21K 9/00
                                                     257/676
(Continued)

FOREIGN PATENT DOCUMENTS

CA   CN204144314    *  2/2015  ............ H01L 33/48
JP   H10-173225 A       6/1998
(Continued)

OTHER PUBLICATIONS

JP2009-094294 (English Translarion).*

*Primary Examiner* — Jessica Manno
*Assistant Examiner* — Delma R Forde

(57) ABSTRACT

Provided is a compact and high-luminance semiconductor light-emitting device which has excellent color rendering characteristics and which enables arbitrary selection of emission color depending on the use of the device. The semiconductor light-emitting device includes a light-emitting element assembly configured by a plurality of fluorescent semiconductor light-emitting elements each of which has external connection electrodes respectively connected to an n-type semiconductor layer and a p-type semiconductor layer, wherein at least an outer surface other than the external connection electrodes of each of the fluorescent semiconductor light-emitting elements is coated with a resin containing a fluorescent material. The light-emitting element assembly is configured such that the external connection
(Continued)

electrodes of the fluorescent semiconductor light-emitting elements are directly connected in series using solder.

7 Claims, 12 Drawing Sheets

(51) Int. Cl.
  *H01L 33/50* (2010.01)
  *H01L 33/62* (2010.01)
  *F21V 3/04* (2006.01)
  *F21Y 101/00* (2016.01)

(52) U.S. Cl.
  CPC ......... *F21Y 2101/00* (2013.01); *H01L 33/504* (2013.01); *H01L 33/507* (2013.01); *H01L 33/62* (2013.01); *H01L 2924/0002* (2013.01)

(58) Field of Classification Search
  USPC .............................. 313/500, 503; 257/88, 89
  See application file for complete search history.

(56) References Cited

U.S. PATENT DOCUMENTS

| | | | | |
|---|---|---|---|---|
| 2006/0193130 A1* | 8/2006 | Ishibashi | ................. | F21K 9/135 362/227 |
| 2008/0237569 A1* | 10/2008 | Nago | ...................... | H01L 33/32 257/13 |
| 2009/0140630 A1* | 6/2009 | Kijima | ................. | C09K 11/661 313/498 |
| 2010/0126265 A1* | 5/2010 | Nakamura | ............... | G01F 22/02 73/149 |
| 2011/0180817 A1* | 7/2011 | Ishizaki | ................... | F21K 9/135 257/88 |
| 2011/0260646 A1* | 10/2011 | Moon | ................. | H01L 25/0753 315/294 |
| 2011/0278605 A1* | 11/2011 | Agatani | ............... | H01L 25/0753 257/89 |
| 2012/0281388 A1* | 11/2012 | Cai | ........................ | F21K 9/135 362/84 |
| 2013/0127329 A1* | 5/2013 | Komada | ................... | F21V 9/02 313/498 |
| 2014/0008694 A1* | 1/2014 | Yamada | ................ | H01L 33/507 257/99 |
| 2014/0098529 A1* | 4/2014 | Hata | .................... | H05K 1/0274 362/231 |

FOREIGN PATENT DOCUMENTS

| | | |
|---|---|---|
| JP | 2007-115928 A | 5/2007 |
| JP | 2009-094294 A | 4/2009 |

* cited by examiner

SEMICONDUCTOR LIGHT-EMITTING DEVICE

CROSS REFERENCE TO RELATED APPLICATION

This application is a new U.S. patent application that claims benefit of JP 2013-206057, filed on Oct. 1, 2013. The entire content of JP 2013-206057 is hereby incorporated by reference.

TECHNICAL FIELD

The present invention relates to a semiconductor light-emitting device in which multiple semiconductor light-emitting elements are connected together, and which is used as a variety of light sources.

BACKGROUND

Light-emitting diodes (hereafter abbreviated as LEDs), which are compound semiconductors, have been widely utilized as light-emitting devices, taking advantage of characteristics such as long operating life and compact size. Furthermore, as a result of the development of LEDs which emit blue light using, for example, gallium nitride based compound semiconductors, the commercialization of white light and pseudo-white light-emitting devices has advanced, and high luminance and high output light-emitting devices, for which LED heat dissipation methods have been devised, have been commercialized as well. In addition, since light-emitting amount is limited by one LED element, an assembled semiconductor light-emitting device is known in which a number of LED elements are mounted on a small mounting area to achieve a large amount of light.

For example, in Japanese Laid-open Patent Publication No. 2007-115928, a semiconductor light-emitting device is disclosed which has first LED elements mounted on a substrate, and a second LED element mounted above the first LED elements in a laminated and shifted state, and each of the first LED elements has p and n electrodes on the upper surfaces thereof, and the second LED element has p and n electrodes on the lower surface thereof. In this semiconductor light-emitting device, the p electrode of the second LED element is attached to the n electrode of one of the adjoining first LED elements, and the n electrode of the second LED element is attached to the p electrode of the other of the adjoining first LED elements. Since the second LED element is hereby mounted in the laminated and shifted state relative to the first LED elements, the mounting area of the LED elements can be reduced and the luminous flux density per unit area can be improved, thus enabling miniaturization of the entire package and improvement of luminosity.

In addition, in Japanese Laid-open Patent Publication No. H10-173225, a semiconductor light-emitting element is disclosed in which three or more of a first LED element and a second LED element are alternately lined up and connected in series into a straight-line shape. In this semiconductor light-emitting element, the first LED element has an n-side electrode and a p-side electrode, and the second LED element has semiconductor layers laminated on the front surface side of a transparent substrate, has an n-side electrode and a p-side electrode, and is disposed so that the side on which the electrodes are provided faces the opposite direction of the first LED element. With the first and second LED elements, the n-side electrodes or the p-side electrodes on the different sides are directly attached to each other. Since there are no gaps between the LED elements, this semiconductor light-emitting element can achieve a size reduction of approximately one-half compared with a light-emitting element having the same amount of light and the same number of LED elements connected therein.

In addition, in Japanese Laid-open Patent Publication No. 2009-94294, a semiconductor light-emitting device is disclosed which has multiple LED elements stacked in two layers on a circuit board, and which is configured such that upper layer LED elements and lower layer LED elements are alternately connected in series through bumps. The circuit board of this semiconductor light-emitting device has a recessed portion for accommodating the LED elements, and the lower layer LED elements are accommodated in the recessed portion. All or some of the upper layer LED elements are electrically connected through bumps to a wiring pattern formed on the circuit board. By such a configuration, the heat generated by the LED elements can be dissipated through the circuit board. In addition, since the upper and lower layer LED elements and the wiring pattern formed on the circuit board are connected without using bonding wires, the light source unit can be made compact, which makes it possible to reduce the size of the semiconductor light-emitting device and increase the lighting intensity of the illumination unit.

SUMMARY

The conventional technologies described above all enable high density mounting, as well as high luminance and high output, of LED elements. However, with such conventional technologies, it has not been possible to sufficiently satisfy demand for excellent color rendering characteristics required for light-emitting devices in recent years, i.e., emitting light that is close to pure white light, emitting light in a variety of emission colors in accordance with the use of the device, etc.

Thereupon, an object of the present invention is to provide a compact and high-luminance semiconductor light-emitting device which has excellent color rendering characteristics and which enables arbitrary selection of emission color in accordance with the use of the device.

Provided is a semiconductor light-emitting device including a light-emitting element assembly configured by a plurality of fluorescent semiconductor light-emitting elements each of which has external connection electrodes respectively connected to an n-type semiconductor layer and a p-type semiconductor layer, wherein at least an outer surface other than the external connection electrodes of each of the fluorescent semiconductor light-emitting elements is coated with a resin containing a fluorescent material. The light-emitting element assembly is configured such that the external connection electrodes of the fluorescent semiconductor light-emitting elements are directly connected in series using solder.

Preferably, in the light-emitting element assembly, the external connection electrodes of neighboring fluorescent semiconductor light-emitting elements are faced toward one another and connected, and thereby the neighboring fluorescent semiconductor light-emitting elements overlap in a depthwise direction, and the plurality of fluorescent semiconductor light-emitting elements are disposed separately into an upper layer and a lower layer.

Preferably, in the light-emitting element assembly, neighboring fluorescent semiconductor light-emitting elements are connected in a straight-line direction or a perpendicular direction.

Preferably, the semiconductor light-emitting device includes two or more light-emitting element assemblies, and the light-emitting element assemblies are connected in parallel.

Preferably, the semiconductor light-emitting device further includes a metal plate, and an insulating substrate which has conduction patterns formed thereon and a through hole, the insulating substrate being laminated on the metal plate, wherein the light-emitting element assembly is disposed within the through hole, the fluorescent semiconductor light-emitting elements of the lower layer are in close contact with the metal plate exposed by the through hole, the fluorescent semiconductor light-emitting elements on ends of the light-emitting element assembly are disposed on the upper layer, and the external connection electrodes of the fluorescent semiconductor light-emitting elements on the ends are electrically connected to the conduction patterns, and thereby a driving voltage is supplied to the light-emitting element assembly.

Preferably, the fluorescent material of the fluorescent semiconductor light-emitting elements of the upper layer and the fluorescent material of the fluorescent semiconductor light-emitting elements of the lower layer differ from each other.

Preferably, the fluorescent material of the fluorescent semiconductor light-emitting elements of the upper layer is a green fluorescent material, and the fluorescent material of the fluorescent semiconductor light-emitting elements of the lower layer is a red fluorescent material.

Preferably, the semiconductor light-emitting device further includes a sealing material which is made of resin containing a diffusing agent, the sealing material sealing the light-emitting element assembly.

Preferably, the semiconductor light-emitting device further includes a sealing material which is made of resin containing a fluorescent material, the sealing material sealing the light-emitting element assembly.

Preferably, the light-emitting element assembly is configured such that the fluorescent semiconductor light-emitting elements are connected in series in a substantially squared 'U' shape, and the semiconductor light-emitting device further includes an electrode unit which supports the light-emitting element assembly and supplies a driving voltage to the light-emitting element assembly.

Preferably, the semiconductor light-emitting device further includes a substantially spherical resin cover which seals the light-emitting element assembly.

The semiconductor light-emitting device described above is configured by fluorescent semiconductor light-emitting elements of which an outer surface is coated with a resin containing a fluorescent material, which makes it possible to coat each semiconductor light-emitting element with a resin containing a different fluorescent material. Thus, it is possible to provide a semiconductor light-emitting device which has excellent color rendering characteristics and which enables selection of a variety of emission colors in accordance with the use of the device.

In addition, by facing each other and directly connecting the neighboring electrodes of fluorescent semiconductor light-emitting elements, the neighboring fluorescent semiconductor light-emitting elements overlapping in a depth-wise direction, which leads to a two-layer configuration with an upper layer and a lower layer. As a result, a semiconductor light-emitting device can be realized that has high mounting density, and is compact in size but has high luminance and high output. In addition, in the semiconductor light-emitting device described above, the fluorescent semiconductor light-emitting elements are directly connected to each other, and the fluorescent semiconductor light-emitting elements on the lower layer side are in close contact with the metal plate, so heat dissipation performance is excellent. Moreover, by connecting the fluorescent semiconductor light-emitting elements in series in a substantially squared 'U' shape resembling the shape of light-bulb-type filaments, and sealing the fluorescent semiconductor light-emitting elements with a substantially spherical resin, it is possible to realize a semiconductor light-emitting device whose appearance and emitted light shape are equivalent to those of an incandescent light bulb.

BRIEF DESCRIPTION OF THE DRAWINGS

Other features and advantages of the present invention will be apparent from the ensuing description, taken in conjunction with the accompanying drawings, in which.

DESCRIPTION

Specific exemplary embodiments of a semiconductor light-emitting device and variations thereof will be described in detail below based on the drawings.

A feature of a first exemplary embodiment is that multiple fluorescent semiconductor light-emitting elements connected in series are configured into two layers, i.e., an upper layer and a lower layer, and are configured into light-emitting element assemblies in which each light-emitting element is coated with a resin containing a fluorescent material which differs between the upper layer and the lower layer. A feature of a second exemplary embodiment is that a fluorescent material is contained in a resin that seals a light-emitting element assembly similar to that in the first exemplary embodiment. A feature of a third exemplary embodiment is that fluorescent semiconductor light-emitting elements are connected in series in a substantially squared 'U' shape to form light-bulb-type light-emitting devices which provide emitted light shape resembling the shape of light-bulb-type filaments.

Figure 1A:
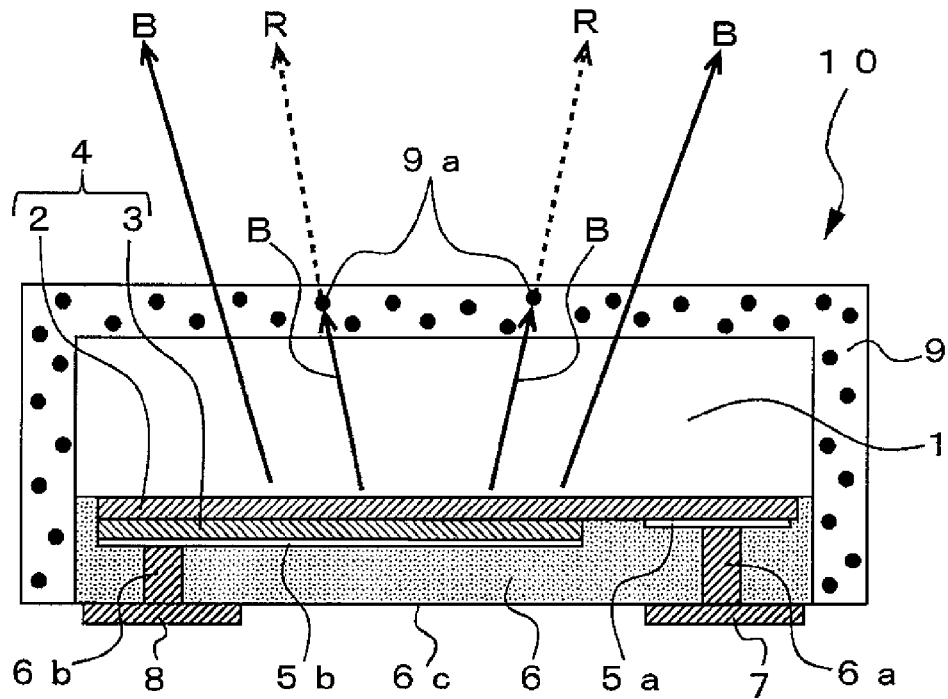
FIGS. 1A and 1B are a cross-sectional view and a rear side view of a fluorescent semiconductor light-emitting element.
Figure 1B:
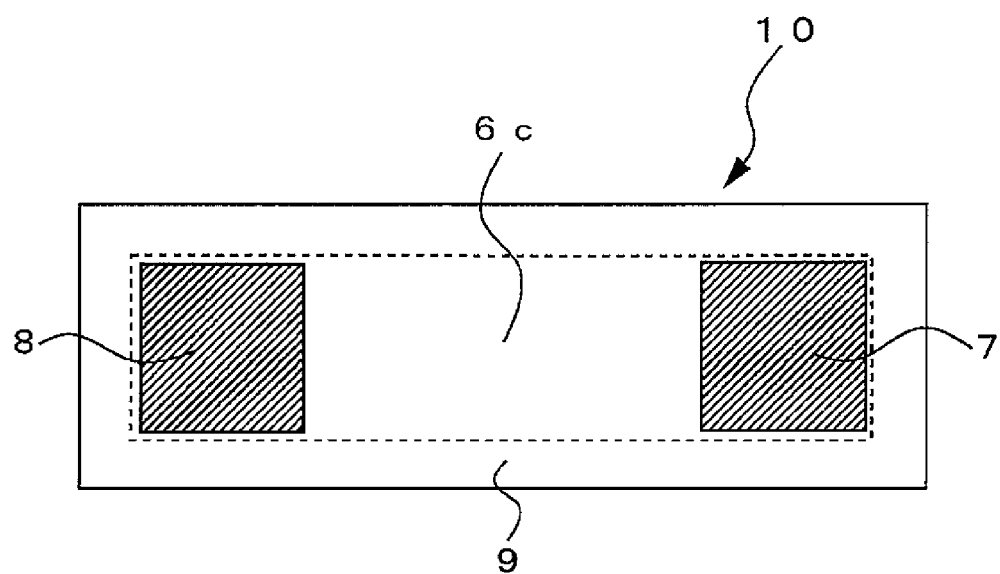

First, the structure of a fluorescent semiconductor light-emitting element (hereafter abbreviated as fluorescent LED) will be described using FIGS. 1A and 1B. FIGS. 1A and 1B illustrate a fluorescent LED schematically. In FIG. 1A, a fluorescent LED 10 has an n-type nitride semiconductor layer 2 and a p-type nitride semiconductor layer 3 which are formed on a transparent substrate 1 constituted by a sapphire substrate, and has an n-side electrode 5a and a p-side electrode 5b on the n-type nitride semiconductor layer 2 and the p-type nitride semiconductor layer 3, respectively. A semiconductor light-emitting element 4 (hereafter abbreviated as LED element 4) is formed by the laminated structure of the n-type nitride semiconductor layer 2 and the p-type nitride semiconductor layer 3.

Moreover, the semiconductor layers are coated with an insulating layer 6 made of a resin material. Through holes 6a and 6b are provided on the insulating layer 6. External connection electrodes 7 and 8 formed on an electrode surface 6c, which constitutes a lower surface of the insulating layer 6 on the drawing, are connected to the n-side electrode 5a and the p-side electrode 5b through the through holes 6a and 6b, respectively. In other words, the external connection electrode 7 is connected to the n-side electrode 5a, and the external connection electrode 8 is connected to the p-side electrode 5b.

In addition, outer surfaces of the fluorescent LED 10 except for the electrode surface 6c on which the external connection electrodes 7 and 8 are formed, i.e., an upper surface of the transparent substrate 1 on the drawing, sides of the transparent substrate 1, and sides of the insulating layer 6 are coated with a fluorescent resin 9 constituting a resin that contains a fluorescent material 9a. Note that, although not illustrated in the drawing, it is also acceptable for the fluorescent resin 9 to coat the electrode surface 6c, except for the areas of the external connection electrodes 7 and 8.

FIG. 1B is a drawing when viewed from a rear side of the fluorescent LED 10, i.e., the electrode surface 6c on which the external connection electrodes 7 and 8 are formed. As illustrated in the drawing, the external connection electrodes 7 and 8 are substantially square, and are disposed as a pair in a lengthwise direction of the fluorescent LED 10. A rectangle delineated by a broken line on the drawing represents a boundary between the insulating layer 6 and the fluorescent resin 9 that coats the insulating layer 6.

Assuming that the LED element 4 is a blue LED, and the fluorescent material 9a contained in the fluorescent resin 9 is a red fluorescent material, by means of supplying a predetermined driving voltage between the external connection electrodes 7 and 8 by a driving unit not illustrated, blue light B and red light R which results from wavelength conversion of the blue light B by the fluorescent material 9a are emitted from the fluorescent LED 10, as illustrated in FIG. 1A. The upper surface and side surfaces of the fluorescent LED 10 are broadly covered with the fluorescent resin 9, so the blue light B and the red light R are broadly diffused not only to the upper surface but to the side surfaces as well.

Figure 2A:
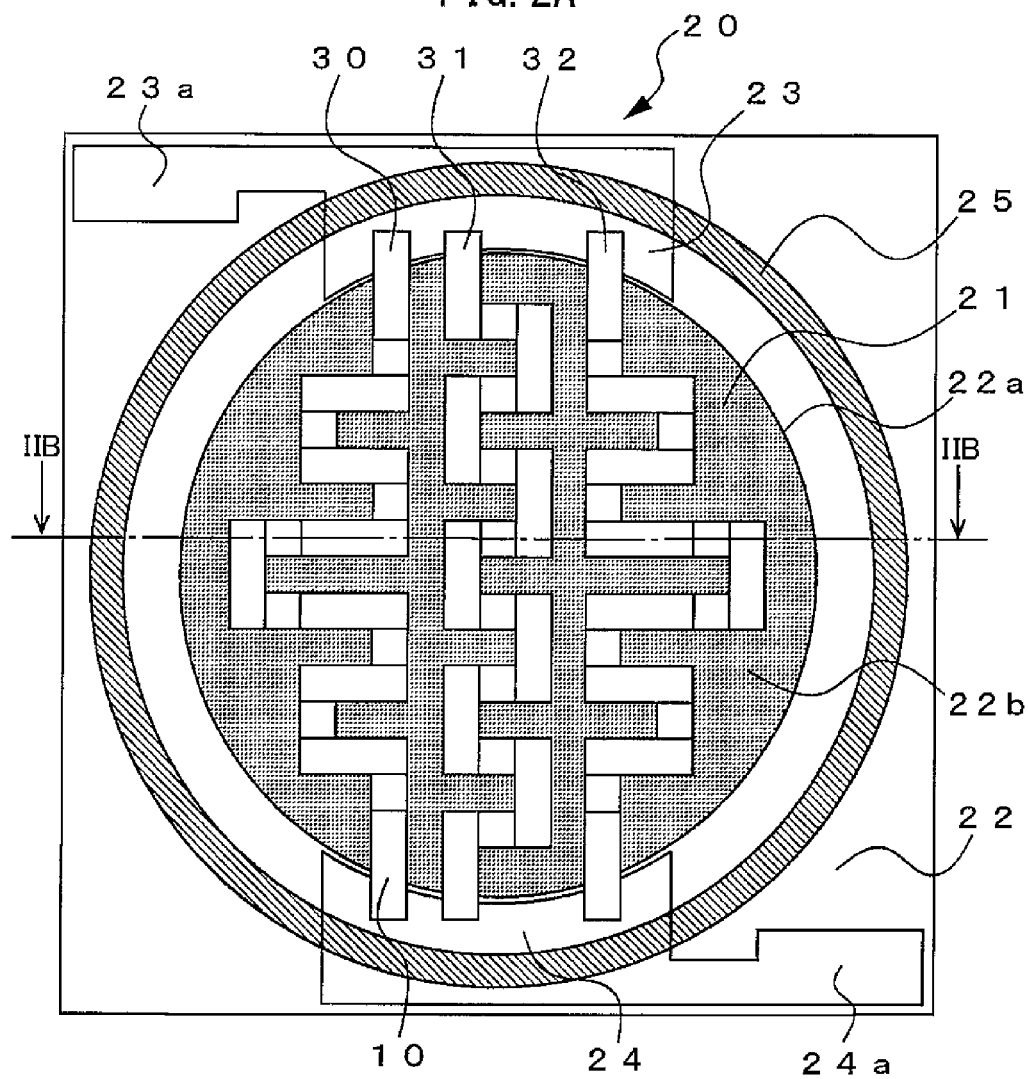
FIGS. 2A and 2B are a top view and a cross-sectional view of the semiconductor light-emitting device according to the first exemplary embodiment.
Figure 2B:
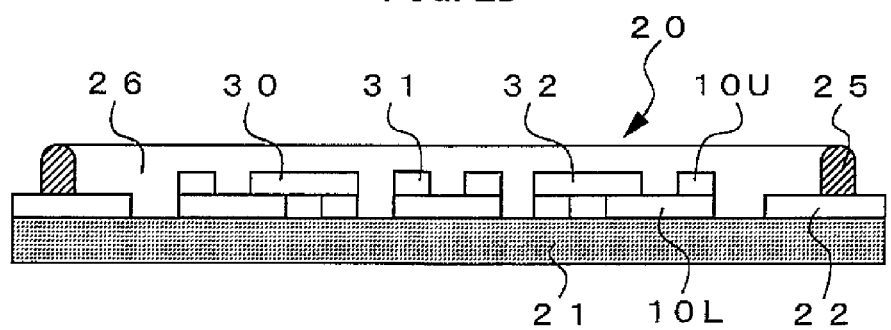

Next, the configuration of the first exemplary embodiment will be described using FIGS. 2A and 2B. FIG. 2A is a top view of a semiconductor light-emitting device, and FIG. 2B is a cross-sectional view of the semiconductor light-emitting device along a cutting plane line IIB-IIB in FIG. 2A. In FIGS. 2A and 2B, the reference sign 20 indicates the semiconductor light-emitting device of the first exemplary embodiment. In the semiconductor light-emitting device 20, an insulating substrate 22 is laminated on and fixedly adhered to a surface of a substantially square metal plate 21 made of, for example, aluminum material.

A through hole 22a is formed in a central portion of the insulating substrate 22, and the surface of the metal plate 21 is exposed through the through hole 22a. In other words, the through hole 22a is formed in the insulating substrate 22, and a lower surface (bottom surface) of the through hole 22a is configured by the metal plate 21. Thereby, a circular recessed area is formed in the central portion of the insulating substrate 22, which results in disposing an assembly of the fluorescent LEDs 10 described below in the recessed portion. The metal plate 21 provides the function to dissipate heat generated by the fluorescent LEDs 10 and the function to reflect emitted light toward the front surface.

On the surface of the insulating substrate 22, a pair of conduction patterns 23 and 24 made of, for example, copper foil is formed. The conduction patterns 23 and 24 are formed so as to describe an arc following and opposing a portion of a border of the through hole 22a. Ends of the conduction patterns 23 and 24 respectively extend to diagonally opposite corners of the insulating substrate 22, and respectively form external electrodes 23a and 24a.

The reference signs 30, 31, and 32 indicate three light-emitting element assemblies (hereafter abbreviated as LED assemblies) in which the fluorescent LEDs 10 described above are connected in series. In each of the LED assemblies 30, 31, and 32, the neighboring fluorescent LEDs 10 are disposed so as to face each other, and the neighboring external connection electrodes 7 and 8 (see FIGS. 1A and 1B) are electrically connected using an electrical connection material such as solder (not illustrated). By connecting neighboring fluorescent LEDs 10 so as to face each other, the fluorescent LEDs 10 overlap in a depthwise direction and form a two-layer structure with an upper layer and a lower layer, as illustrated in FIG. 2B.

The LED assemblies 30, 31, and 32 thus configured are disposed in the through hole 22a of the insulating substrate 22, and the fluorescent LEDs 10 on the lower layer side of each of the LED assemblies 30, 31, and 32 are in close contact with the surface of the metal plate 21 exposed through the through hole 22a. In addition, the external connection electrodes 7 and 8 of the fluorescent LEDs 10 on the upper layer side located at both ends of each of the LED assemblies 30, 31, and 32 are connected to the conduction patterns 23 and 24.

The fluorescent LEDs 10 that are in close contact with the metal plate 21 are referred to as lower layer side fluorescent LEDs 10L, and the fluorescent LEDs 10 that are separated from the metal plate 21 are referred to as upper layer side fluorescent LEDs 10U. In this way, the LED assemblies 30, 31, and 32 are disposed inside the through hole 22a, and thereby the circular area formed by the through hole 22a constitutes a light-emitting area 22b of the semiconductor light-emitting device 20. The connection configuration of the fluorescent LEDs 10 which configures each of the LED assemblies 30, 31, and 32 will be described in detail below.

The reference sign 25 is a sealing frame which encloses a periphery of the through hole 22a of the insulating substrate 22. An inner side of the sealing frame 25 is filled with a sealing material 26 including a transparent material, thereby sealing the LED assemblies 30, 31, and 32. In the present exemplary embodiment, a diffusing agent (not illustrated) which diffuses the emitted light from the LED assemblies 30, 31, and 32 is contained in the sealing material 26.

Figure 3:
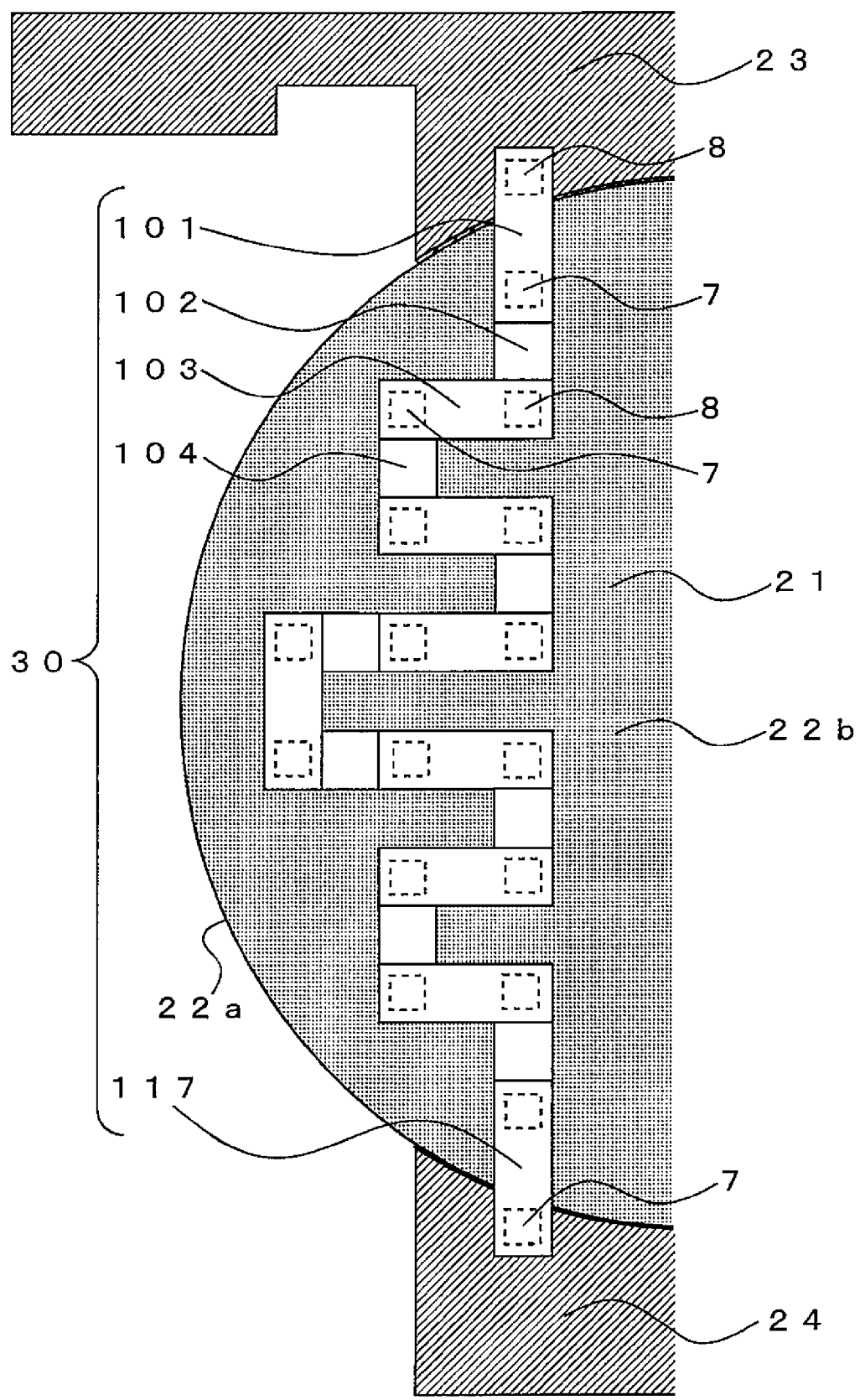
FIG. 3 is a top view in which the semiconductor light-emitting device according to the first exemplary embodiment is partially enlarged.

Next, the connection of the fluorescent LEDs 10 configuring the LED assemblies 30, 31, and 32 will be described in detail using FIG. 3. FIG. 3 is an enlarged top view in which a surrounding area of the LED assembly 30 of the semiconductor light-emitting device 20 illustrated in FIGS. 2A and 2B is enlarged. In FIG. 3, the LED assembly 30 is configured by a total of 17 fluorescent LEDs indicated by reference signs 101, 102, 103, 104, ... 117.

A fluorescent LED 101 at the uppermost on the drawing is disposed so that the electrode surface 6c (see FIG. 1B) thereof faces backward, and the external connection electrode 8 (the p-type semiconductor side, indicated by a broken line) is electrically connected to the conduction pattern 23. The external connection electrode 7 (the n-type semiconductor side, indicated by a broken line) of the same fluorescent LED 101 is directly connected, using solder or the like, to the external connection electrode 8 (not illustrated) of a neighboring fluorescent LED 102 which is disposed so that the electrode surface 6c thereof faces frontward. Moreover, the external connection electrode 7 (not illustrated) of the same fluorescent LED 102 is directly connected to the external connection electrode 8 (indicated by a broken line) of a next neighboring fluorescent LED 103, and the external connection electrode 7 (indicated by a broken line) of the same fluorescent LED 103 is connected to the external connection electrode 8 (not illustrated) of a next neighboring fluorescent LED 104.

In this manner, the external connection electrodes 7 and 8 of the fluorescent LEDs 10 are sequentially and directly connected to the external connection electrodes 7 and 8 of neighboring fluorescent LEDs 10. A fluorescent LED 117 at the lowermost on the drawing of the LED assembly 30 is disposed so that the electrode surface 6c thereof faces backward, and the external connection electrode 7 (the n-type semiconductor side, indicated by a broken line) is electrically connected to the conduction pattern 24. The reason why the neighboring external connection electrodes 7 and 8 of the fluorescent LEDs 10 can be sequentially and directly connected is that the electrode surfaces 6c of neighboring fluorescent LEDs 10 are disposed so as to face each other. In this way, the fluorescent LEDs 10 are sequentially connected, and an LED assembly of multiple fluorescent LEDs 10 connected in series is thereby formed.

As a result of the above connections, by supplying a predetermined plus voltage to the external electrode 23a of the conduction pattern 23 and supplying a predetermined minus voltage to the external electrode 24a of the conduction pattern 24, a driving current flows in a forward direction to each of the fluorescent LEDs 101 to 117 of the LED assembly 30, and light is emitted. The other LED assemblies 31 and 32 are connected in the same manner.

In addition, the fluorescent LEDs 10 which configure each of the LED assemblies 30, 31, and 32 are connected to neighboring fluorescent LEDs 10 in either a straight-line direction or a perpendicular direction. For example, in FIG. 3, the fluorescent LEDs 101 and 102 are connected in a straight-line direction, while the fluorescent LEDs 102 and 103 are connected in the perpendicular direction. This is due to the fact that the shape of the external connection electrodes 7 and 8 of the fluorescent LEDs 10 is substantially square (see FIG. 1B), and regardless of whether the position of the electrodes is in a straight-line direction or a perpendicular direction, the electrodes are formed in positions that do not change with respect to the form of the fluorescent LEDs 10, and are thus capable of corresponding to both connections in a straight-line direction and a perpendicular direction.

The direction in which neighboring fluorescent LEDs 10 are connected is arbitrary, and can be decided in accordance with the number of fluorescent LEDs 10 which configure a single LED assembly and the shape of the light-emitting area. In the present exemplary embodiment, in order for the LED assembly 30 to be allotted a left side area, on the drawing, of the circular light-emitting area 22b, a straight-line direction and a perpendicular direction are chosen such that the light-emitting pattern extends toward the left side, on the drawing, of the light-emitting area 22b.

In order for the LED assembly 31 to be allotted a central area of the circular light-emitting area 22b (see FIGS. 2A and 2B), a straight-line direction and a perpendicular direction are chosen such that the light-emitting pattern forms a belt shape. Moreover, in order for the LED assembly 32 to be allotted a right side area, on the drawing, of the circular light-emitting area 22b (see FIGS. 2A and 2B), a straight-line direction and a perpendicular direction are chosen such that the light-emitting pattern extends toward the right side, on the drawing, of the light-emitting area 22b. The LED assemblies 30, 31, and 32 are connected in parallel with the conduction patterns 23 and 24, so it is preferable that the number of fluorescent LEDs 10 configuring each of the LED assemblies 30, 31, and 32 be the same.

In addition, the number of LED assemblies in the present exemplary embodiment is three, but the number is arbitrary. For example, when the light-emitting area 22b is wide, the number of LED assemblies may be increased, and when the light-emitting area 22b is narrow, the number of LED assemblies may be decreased.

Figure 4A:
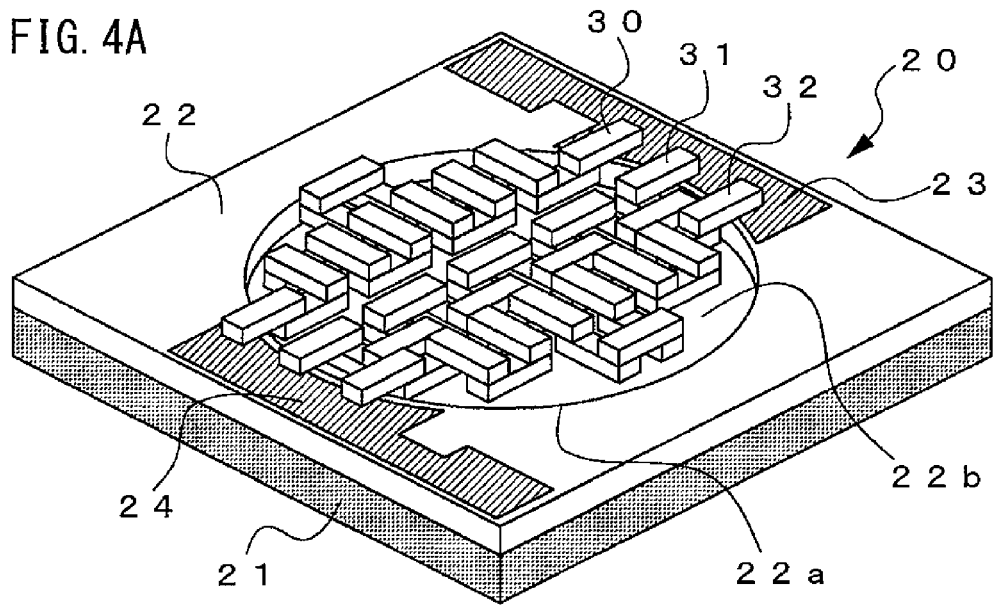
FIGS. 4A and 4B are a perspective view of the semiconductor light-emitting device according to the first exemplary embodiment, and a perspective view illustrating an example of light-emitting element assemblies mounted on the semiconductor light-emitting device.

Next, the functions of the upper layer side fluorescent LEDs 10U and the lower layer side fluorescent LEDs 10L which configure the LED assemblies will be described using FIGS. 4A and 4B. FIG. 4A is a perspective view of the semiconductor light-emitting device 20 illustrated in FIGS. 2A and 2B. In FIG. 4a, the sealing frame 25 and the sealing material 26 are omitted in order to make the configuration of the LED assemblies 30, 31, and 32 easier to understand. As is clearly illustrated in FIG. 4A, the LED assemblies 30, 31, and 32 are disposed so as to be inserted within the through hole 22a formed in the insulating substrate 22, and the interior of the through hole 22a constitutes the light-emitting area 22b.

Figure 4B:
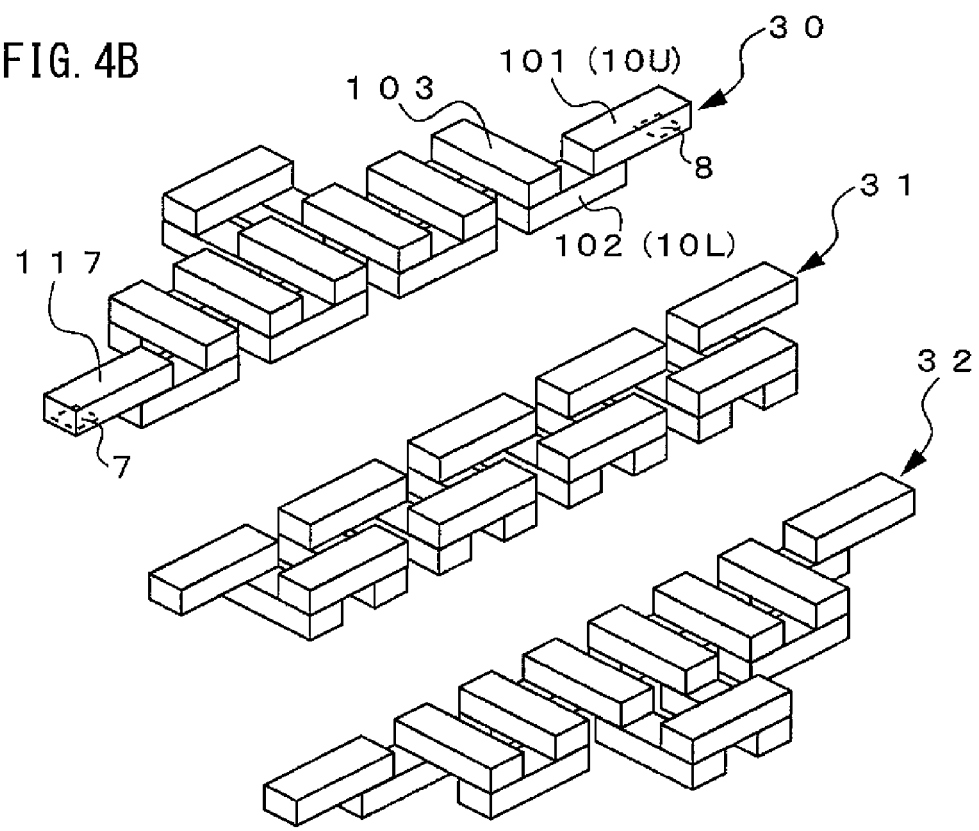

FIG. 4B is an enlarged perspective view of the LED assemblies 30, 31, and 32. Since the fluorescent LEDs 10 which configure each of the LED assemblies 30, 31, and 32 are connected facing each other, it can be understood that neighboring fluorescent LEDs 10 overlap in the depthwise direction and are disposed in an upper layer and a lower layer. For example, in the LED assembly 30, the fluorescent LEDs 101 and 103 are upper layer side fluorescent LEDs 10U, and the fluorescent LED 102 is a lower layer side fluorescent LED 10L.

The fluorescent LEDs 10 located at both ends of each of the LED assemblies 30, 31, and 32 are upper layer side fluorescent LEDs 10U. For example, as illustrated in the drawing, the fluorescent LEDs 101 and 117 located at both ends of the LED assembly 30 are located on the upper layer side. As a result of this configuration, although the location in a heightwise direction of the conduction patterns 23 and 24 formed on the surface of the insulating substrate 22 is higher than the surface of the metal plate 21 located on the lower surface of the through hole 22a by an amount equal to the thickness of the insulating substrate 22, the external connection electrode 8 of the fluorescent LED 101 and the external connection electrode 7 of the fluorescent LED 117, both of which are on the upper layer side, are in contact with the conduction patterns 23 and 24 formed on the surface of the insulating substrate 22, and can be electrically connected using solder or the like.

In addition, the lower layer side fluorescent LEDs 10L (for example, the fluorescent LED 102 of the LED assembly 30) are in close contact with the metal plate 21 exposed by the through hole 22a, as described above. This is due to the fact that the location of the lower layer side fluorescent LEDs 10L and the location of the metal plate 21 located on the lower surface of the through hole 22a match each other. The upper layer side fluorescent LEDs 10U provide the function to connect to the conduction patterns 23 and 24 and input a driving voltage, and the lower layer side fluorescent LEDs 10L provide the function to be in close contact with the metal plate 21 and efficiently transfer generated heat from the LED assemblies to the metal plate 21.

In order to connect the external connection electrodes 7 and 8 of the upper layer side fluorescent LEDs 10U to the conduction patterns 23 and 24 of the insulating substrate 22, and make the lower layer side fluorescent LEDs 10L come into contact with the metal plate 21, it is sufficient to make the thickness of the fluorescent LEDs 10 in the heightwise direction and the thickness of the insulating substrate 22 match each other.

In addition, in the present exemplary embodiment, there are two types of a fluorescent material 9a contained by the fluorescent resin 9 (see FIGS. 1A and 1B) coating the fluorescent LEDs 10 which configure each of the LED assemblies 30, 31, and 32. The fluorescent resin 9 of the upper layer side fluorescent LEDs 10U contains a green fluorescent material, and the fluorescent resin 9 of the lower layer side fluorescent LEDs 10L contains a red fluorescent material. For example, in the LED assembly 30, the fluorescent LEDs 101 and 103 are disposed on the upper layer side, so the fluorescent resin 9 thereof contains a green fluorescent material, and the fluorescent LED 102 is disposed on the lower layer side, so the fluorescent resin 9 thereof contains a red fluorescent material. The fluorescent material is omitted on the drawings.

A red fluorescent material has the property of absorbing green light, so when fluorescent LEDs with a red fluorescent material are disposed on the upper layer side, green light from the lower layer side is absorbed by the red fluorescent material, and the emission of green light decreases. Thus, the fluorescent LEDs 10L disposed on the lower layer side are configured to contain a red fluorescent material.

In this way, the fluorescent material 9a contained in the fluorescent resin 9 coating the fluorescent LEDs 10 that configure each of the LED assemblies 30, 31, and 32 is configured by a green fluorescent material and a red fluorescent material, and the LED elements 4 of the fluorescent LEDs 10 are configured by blue LEDs, as described above. Thus, blue light B from the blue LEDs, green light G which results from wavelength conversion of the blue light B by the green fluorescent material of the upper layer side fluorescent LEDs 10U, and further red light R which results from wavelength conversion of the blue light B by the red fluorescent material of the lower layer side fluorescent LEDs 10L, are emitted from the semiconductor light-emitting device 20.

Figure 5:
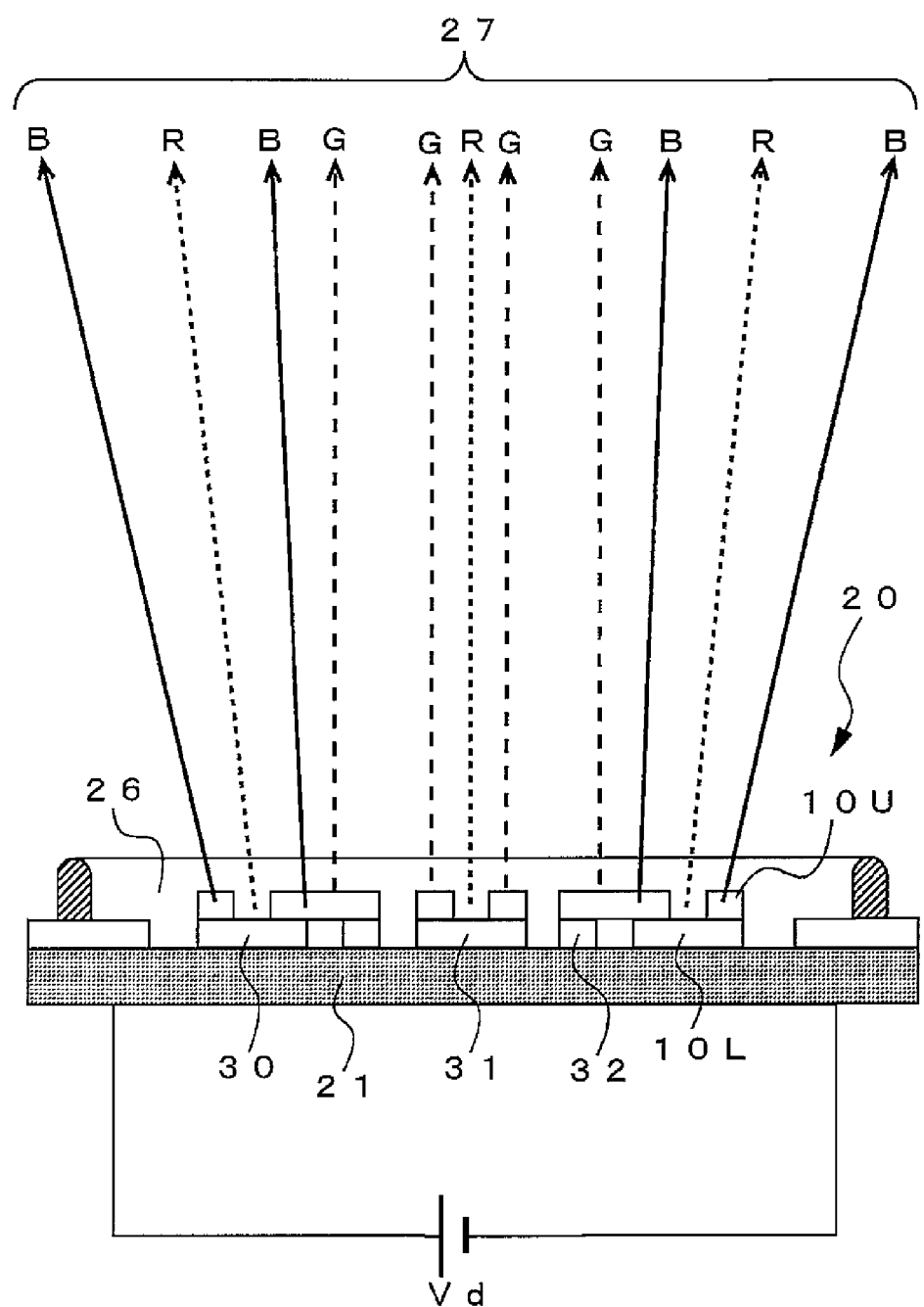
FIG. 5 is a diagram for explaining the operation of the semiconductor light-emitting device according to the first exemplary embodiment.

Next, the operation of the semiconductor light-emitting device 20 will be described using FIG. 5. FIG. 5 schematically illustrates what sorts of light are emitted from the semiconductor light-emitting device 20. In FIG. 5, the LED assemblies 30, 31, and 32 mounted on the semiconductor light-emitting device 20 are configured by two types of fluorescent LEDs—upper layer side fluorescent LEDs 10U and lower layer side fluorescent LEDs 10L—with different fluorescent materials, as described above. When a predetermined driving voltage Vd is supplied from outside to the semiconductor light-emitting device 20, the blue LEDs of the respective fluorescent LEDs 10U and fluorescent LEDs 10L emit light, and blue light B is emitted.

In addition, from the upper layer side fluorescent LEDs 10U, a part of the blue light B is absorbed by the green fluorescent material contained in the fluorescent resin 9, the green fluorescent material gets excited, and wavelength-converted green light G is emitted. Meanwhile, from the lower layer side fluorescent LEDs 10L, a part of the blue light B is absorbed by the red fluorescent material contained in the fluorescent resin 9, the red fluorescent material gets excited, and wavelength-converted red light R is emitted. As a result, from the semiconductor light-emitting device 20, emitted light 27 including the blue light B, green light G, and red light R is emitted. The emitted light 27 is diffused by a diffusing agent (not illustrated) contained in the sealing material 26, and reflected in the upward direction of the drawing by the metal plate 21, and is emitted efficiently.

Figure 6:
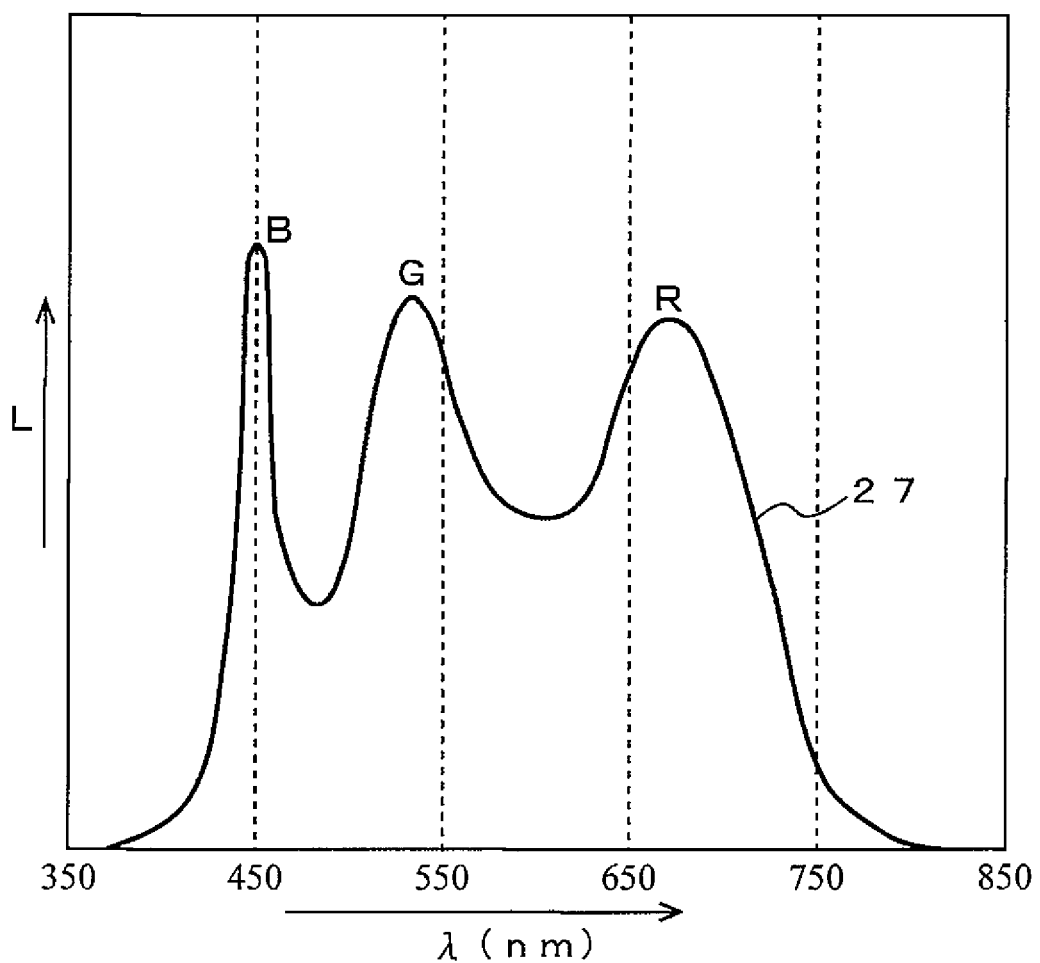
FIG. 6 is a graph illustrating an example of the wavelength distribution of light emitted from the semiconductor light-emitting device according to the first exemplary embodiment.

Next, an example of the wavelength distribution of the emitted light 27 emitted from the semiconductor light-emitting device 20 will be described using FIG. 6. In FIG. 6, the horizontal axis indicates the wavelength λ of the emitted light, and the unit is in nanometers. The vertical axis indicates the luminance L, represented as a relative value. The emitted light 27 from the semiconductor light-emitting device 20 is a light including the blue light B from the blue LEDs, the green light G from wavelength conversion by the green fluorescent material, and the red light R from wavelength conversion by the red fluorescent material, as described above. The wavelength of the blue light B is in the neighborhood of 450 nm, and the wavelength distribution thereof is narrow as a result of the emitted light from blue LEDs, while the wavelengths of the green light G and the red light R have relatively wide distribution characteristics since these lights are respectively converted by the fluorescent materials.

As stated above, in the semiconductor light-emitting device 20, by using the fluorescent LEDs 10 coated with the fluorescent resin 9 that contains the fluorescent material 9a, the contained fluorescent material can be varied individually for each fluorescent LED. Thus, by utilizing fluorescent LEDs which are blue LEDs and individually contain a green fluorescent material or a red fluorescent material excited by the blue light B from the blue LEDs, a semiconductor light-emitting device can be realized which emits the blue light B, the green light G, and the red light R in a well-balanced manner, as illustrated in FIG. 6.

As a result, a high-performance semiconductor light-emitting device can be provided which emits light that has excellent color rendering characteristics and is close to pure white light. Moreover, by changing the ratio between the number of fluorescent LEDs 10 containing a green fluorescent material and the number of fluorescent LEDs 10 containing a red fluorescent material, it is possible to arbitrarily adjust the color of the emitted light in accordance with the use of the device.

In addition, by facing each other and directly connecting the neighboring electrodes of fluorescent LEDs 10, a two-layer structure with an upper layer and a lower layer is achieved, so mounting density can be made higher, and a semiconductor light-emitting device can be realized that is compact, but has high luminance and high output. Furthermore, the lower layer side fluorescent LEDs 10L are in close contact with the metal plate 21, so heat resistance is extremely low. Likewise, the upper layer side fluorescent LEDs 10U are directly connected to the lower layer side fluorescent LEDs 10L without using wires and the like, so heat resistance is low. In this way, a light-emitting device can be provided which can be used in a wide range of temperatures and has excellent heat dissipation characteristics. Note that the fluorescent material contained in the upper layer side fluorescent LEDs 10U and the lower layer side fluorescent LEDs 10L is not limited to a green fluorescent material or a red fluorescent material.

Next, a variation of the first exemplary embodiment will be described using FIG. 7. The basic configuration of the variation is the same as that of the first exemplary embodiment, and only the type of LED elements 4 of the fluorescent LEDs 10 and the type of the fluorescent material 9a contained in the fluorescent resin 9 are different. Thus, a description of the configuration will be omitted, and a description with a focus on differences in the wavelength distribution of the emitted light will be made.

In this variation, the LED elements 4 of the fluorescent LEDs 10 are configured by near ultraviolet LEDs, and the fluorescent resin 9 (see FIGS. 1A and 1B) coating the fluorescent LEDs 10 individually contain, as the fluorescent material 9a, a blue fluorescent material, a green fluorescent material, and/or a red fluorescent material. For example, the upper layer side fluorescent LEDs 10U individually contain a blue fluorescent material and a green fluorescent material, and the lower layer side fluorescent LEDs 10L contain a red fluorescent material.

Figure 7:
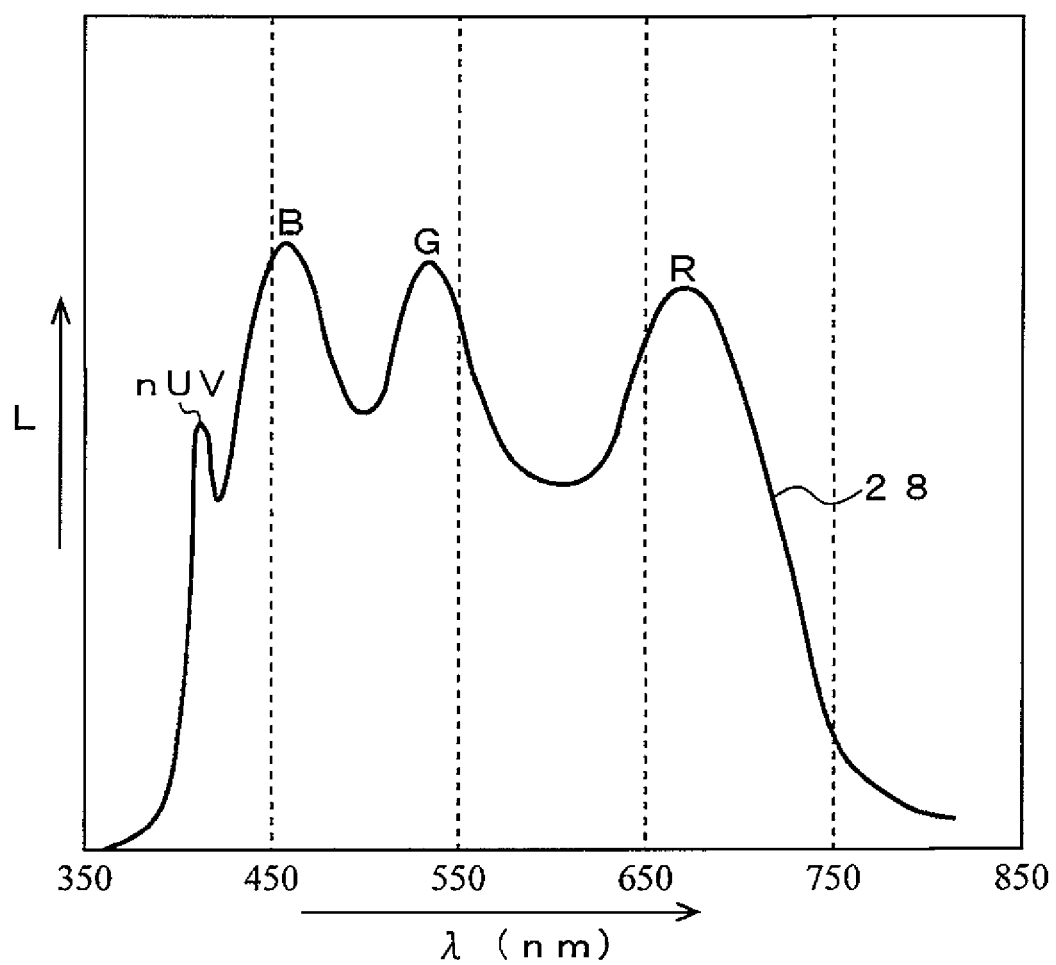
FIG. 7 is a graph illustrating an example of the wavelength distribution of light emitted from the semiconductor light-emitting device according to the variation of the first exemplary embodiment.

FIG. 7 illustrates an example of the wavelength distribution of emitted light 28 from the semiconductor light-emitting device of the variation of the first exemplary embodiment. In FIG. 7, the horizontal axis indicates the wavelength λ of the emitted light, and the vertical axis indicates the luminance L, represented as a relative value. The emitted light 28 from the semiconductor light-emitting device of the variation is a light including near ultraviolet light nUV from the near ultraviolet LEDs, blue light B from wavelength conversion by the blue fluorescent material, green light G from wavelength conversion by the green fluorescent material, and red light R from wavelength conversion by the red fluorescent material.

The wavelength distribution of the variation is different from the wavelength distribution of the first exemplary embodiment (see FIG. 6), and has relatively wide distribution characteristics due to the fact that the blue light B is also a converted light by the fluorescent material. The small wavelength peak in the neighborhood of 400 nm corresponds to the near ultraviolet light nUV from the near ultraviolet LEDs. The near ultraviolet light nUV serves as excitation light, and excites the respective fluorescent materials.

As stated above, in the variation of the first exemplary embodiment, all of the blue light B, green light G, and red light R are obtained by the fluorescent LEDs which individually contain the fluorescent material(s). As a result, a semiconductor light-emitting device can be provided which can adjust the color tone of the emitted light in a wide range in accordance with the use of the device by selecting the ratio of the numbers of the respective fluorescent LEDs 10 which configure the LED assemblies. For example, an emitted light with a tinge of red and warmth can be obtained when the number of fluorescent LEDs containing the red fluorescent material is increased, and an emitted light with a tinge of blue and cool atmosphere can be obtained when the number of fluorescent LEDs containing the blue fluorescent material is increased.

Next, a semiconductor light-emitting device of the second exemplary embodiment will be described using FIG. 8. The basic configuration of the second exemplary embodiment is the same as that of the first exemplary embodiment, and only the type of the fluorescent material 9a contained in the fluorescent resin 9 of the fluorescent LEDs 10 and the inclusion of the sealing material 26 which seals the LED assemblies are different. Thus, an overlapping description of the configuration will be omitted by giving the same number to the same component, and a description with a focus on the operation of the semiconductor light-emitting device and the wavelength distribution of the emitted light will be made. In the second exemplary embodiment, the LED elements 4 of the fluorescent LEDs 10 are blue LEDs as is the case in the first exemplary embodiment, and the fluorescent material 9a (see FIG. 1A) contained in the fluorescent resin 9 coating the outer surface of the fluorescent LEDs 10 is a YAG fluorescent material, and a red fluorescent material is contained in the sealing material 26.

Figure 8:
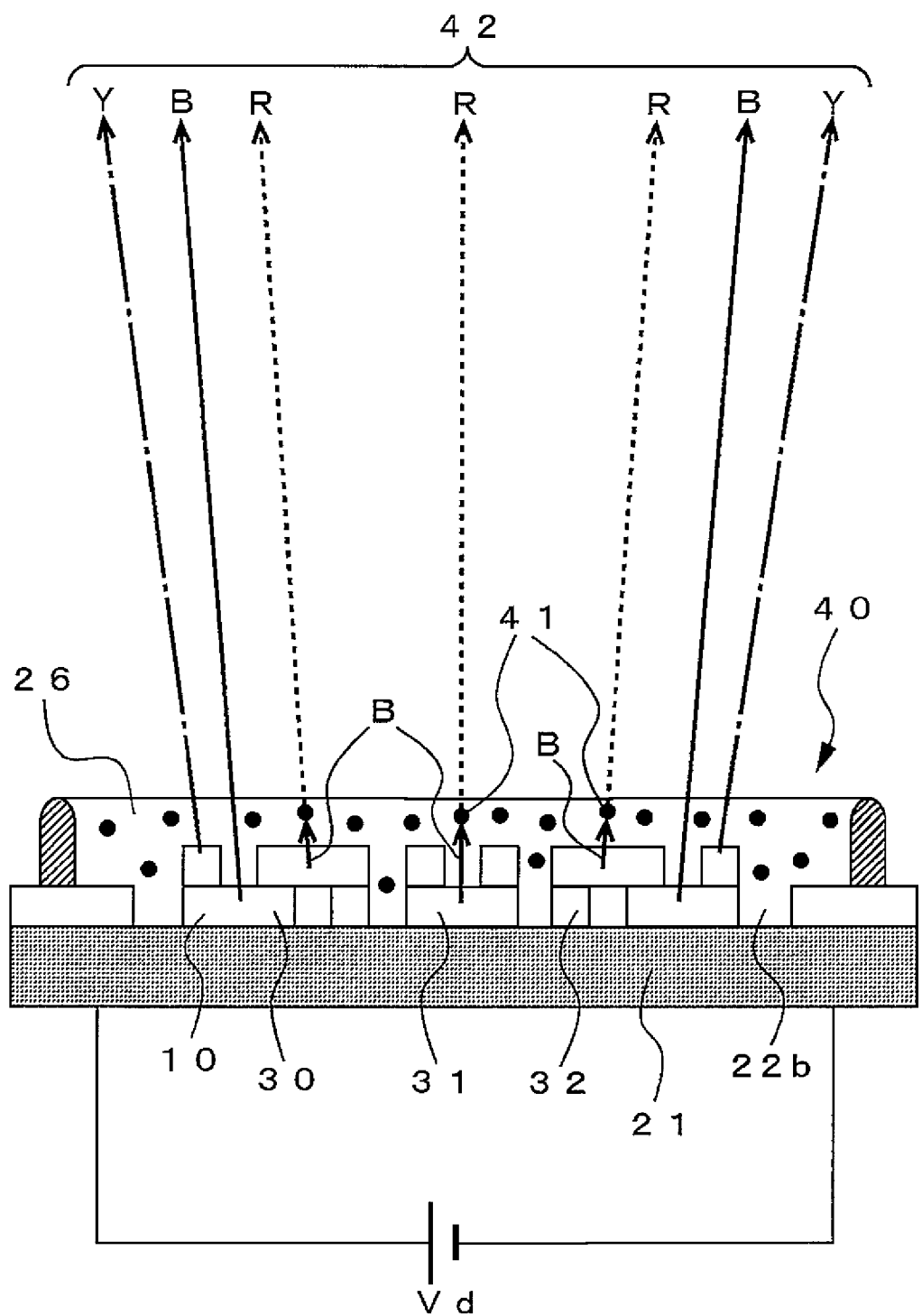
FIG. 8 is a diagram for explaining the operation of the semiconductor light-emitting device according to the second exemplary embodiment.

FIG. 8 is a side view equivalent to the side view of the first exemplary embodiment (see FIG. 2B) with a vertical ratio enlarged in order to make the description easier to understand. In FIG. 8, the reference sign 40 indicates the semiconductor light-emitting device of the second exemplary embodiment. The LED assemblies 30, 31, and 32 configured by the fluorescent LEDs 10 are disposed in close contact with the surface of the metal plate 21 exposed to the light-emitting area 22b of the semiconductor light-emitting device 40. Each fluorescent LED 10 is configured by a blue LED, not illustrated, and a YAG fluorescent material is contained in the fluorescent resin 9 (not illustrated here) coating the fluorescent LED 10, as described above. In addition, all of the LED assemblies 30, 31, and 32 are sealed by the sealing material 26, which contains substantially uniformly red fluorescent material 41 (indicated by black dots), as described above.

When a predetermined driving voltage Vd is supplied from outside to the semiconductor light-emitting device 40, the individual fluorescent LEDs 10 which configure the LED assemblies 30, 31, and 32 operate, and thereby blue light B is emitted from the blue LEDs. When some of the blue light B is absorbed by the YAG fluorescent material (not illustrated) contained in the fluorescent resin 9, the YAG fluorescent material gets excited and emits yellow light Y. Meanwhile, when some of the blue light B is absorbed by the red fluorescent material 41 contained in the sealing material 26, the red fluorescent material 41 gets excited and emits red light R. As a result of the above operation, emitted light 42 including the blue light B, yellow light Y, and red light R is emitted. The actual emitted light 42 is a light including the blue light B, yellow light Y, and red light R substantially uniformly mixed together.

Figure 9:
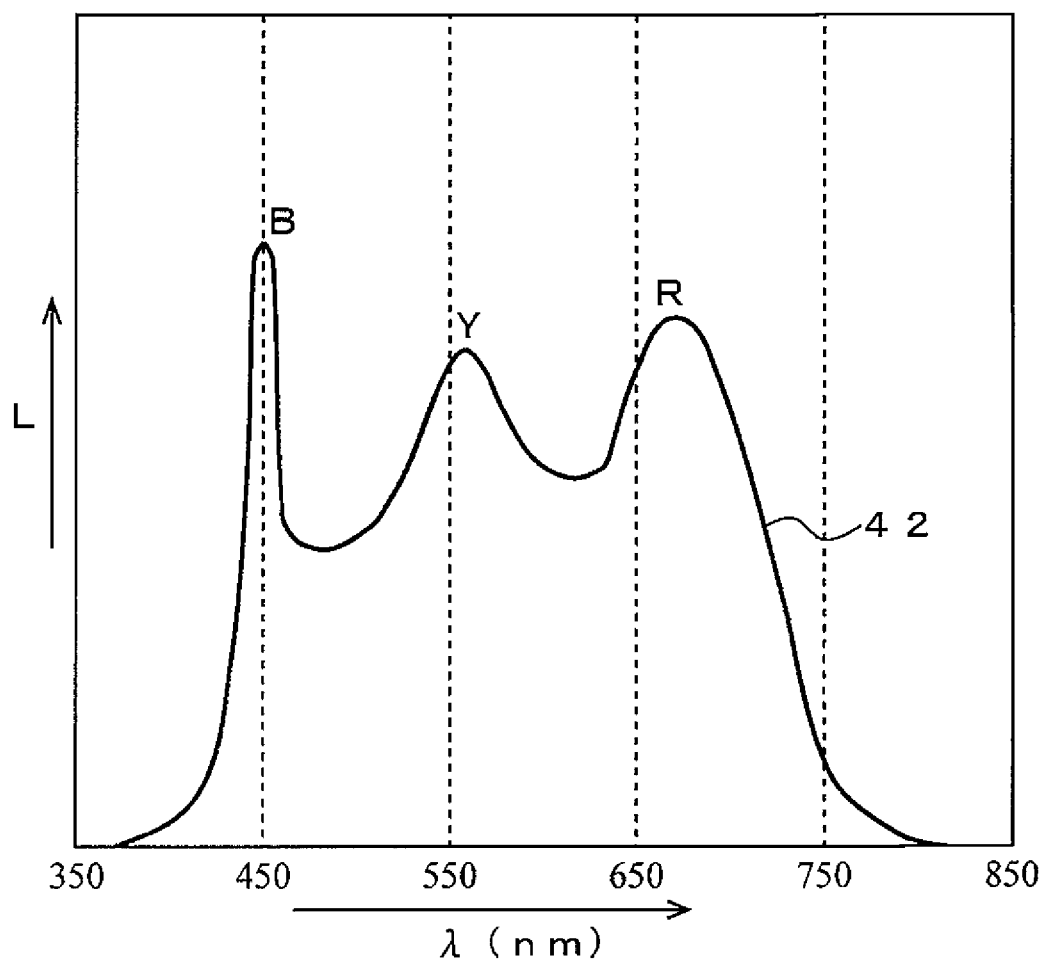
FIG. 9 is a graph illustrating an example of the wavelength distribution of light emitted from the semiconductor light-emitting device according to the second exemplary embodiment.

Next, an example of the wavelength distribution of the emitted light 42 emitted from the semiconductor light-emitting device 40 will be described using FIG. 9. In FIG.

9, the horizontal axis indicates the wavelength λ of the emitted light 42, and the unit is in nanometers. The vertical axis indicates the luminance L, represented as a relative value. The emitted light 42 from the semiconductor light-emitting device 40 is a light including the blue light B from the blue LEDs, the yellow light Y from wavelength conversion by the YAG fluorescent material, and the red light R from wavelength conversion by the red fluorescent material 41, as described above. The wavelength of the blue light B is in the neighborhood of 450 nm as is the case in the first exemplary embodiment, and the wavelength distribution thereof is narrow as a result of the emitted light from blue LEDs, while the wavelengths of the yellow light Y and the red light R have relatively wide distribution characteristics since these lights are respectively converted by the fluorescent materials.

When the blue light B from the blue LEDs and the yellow light Y from the YAG fluorescent material are included, a pseudo-white light is produced. However, in the second exemplary embodiment, since the sealing material 26 contains the red fluorescent material 41, the red light R is added as well. In this way, emitted light with warmth as a result of addition of redness to the pseudo-white light is obtained. In the second exemplary embodiment, there is only one type of fluorescent LED 10, which contains a YAG fluorescent material, and thus the manufacturing process can be simplified in comparison to the first exemplary embodiment, where two types of fluorescent LEDs are necessary.

In addition, as is the case in the first exemplary embodiment, the fluorescent LEDs 10 are configured by two layers, an upper layer and a lower layer, so mounting density can be made higher, and a semiconductor light-emitting device can be realized that is compact but has high luminance and high output. Furthermore, the lower layer side fluorescent LEDs are in close contact with the metal plate 21, so heat resistance is extremely low, and the upper layer side fluorescent LEDs are directly connected to the lower layer side fluorescent LEDs, so heat resistance is low. In this way, a semiconductor light-emitting device with excellent heat dissipation characteristics can be provided.

Next, a variation of the second exemplary embodiment will be described using FIG. 10. The basic configuration of the variation is the same as that of the second exemplary embodiment, and only the type of the fluorescent material 9a contained in the fluorescent resin 9 that coats the fluorescent LEDs 10, and the type of a fluorescent material contained in the sealing material 26 that seals the LED assemblies are different. Thus, a description of the configuration and operation will be omitted, and a description with a focus on differences in the wavelength distribution of the emitted light will be made. In this variation, the LED elements 4 of the fluorescent LEDs 10 are configured by blue LEDs, the fluorescent material 9a (see FIG. 1A) contained in the fluorescent resin 9 coating the fluorescent LEDs 10 is a green fluorescent material and a red fluorescent material as is the case in the first exemplary embodiment, and a YAG fluorescent material is contained in the sealing material 26.

As the fluorescent material 9a, as is the case in the first exemplary embodiment, a green fluorescent material is contained in the fluorescent resin 9 of the upper layer side fluorescent LEDs 10U, and a red fluorescent material is contained in the fluorescent resin 9 of the lower layer side fluorescent LEDs 10L.

Figure 10:
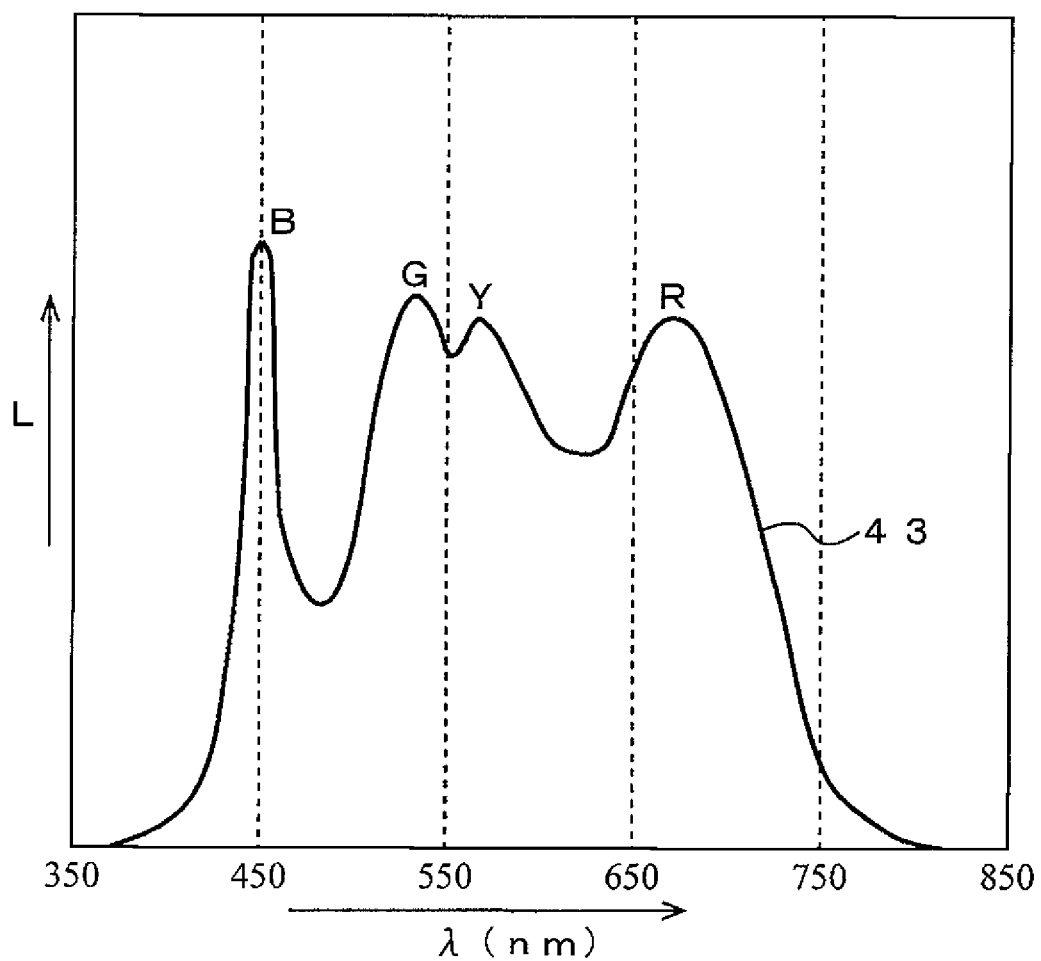
FIG. 10 is a graph illustrating an example of the wavelength distribution of light emitted from the semiconductor light-emitting device according to the variation of the second exemplary embodiment.

FIG. 10 illustrates an example of the wavelength distribution of emitted light 43 from the semiconductor light-emitting device of the variation of the second exemplary embodiment. In FIG. 10, the horizontal axis indicates the wavelength λ of the emitted light, and the vertical axis indicates the luminance L, represented as a relative value. The emitted light 43 from the semiconductor light-emitting device of the variation is a light including blue light B from the blue LEDs, green light G from wavelength conversion by the green fluorescent material, red light R from wavelength conversion by the red fluorescent material, and yellow light Y from the YAG fluorescent material contained in the sealing material 26.

In other words, in comparison to the wavelength distribution of the emitted light 42 (see FIG. 9) according to the second exemplary embodiment, green light G by the green fluorescent material is added to the emitted light 43 of the variation of the second exemplary embodiment. Thus, a high-performance semiconductor light-emitting device can be provided by which emitted light that has excellent color rendering characteristics and is close to pure white light is obtained.

Figure 11:
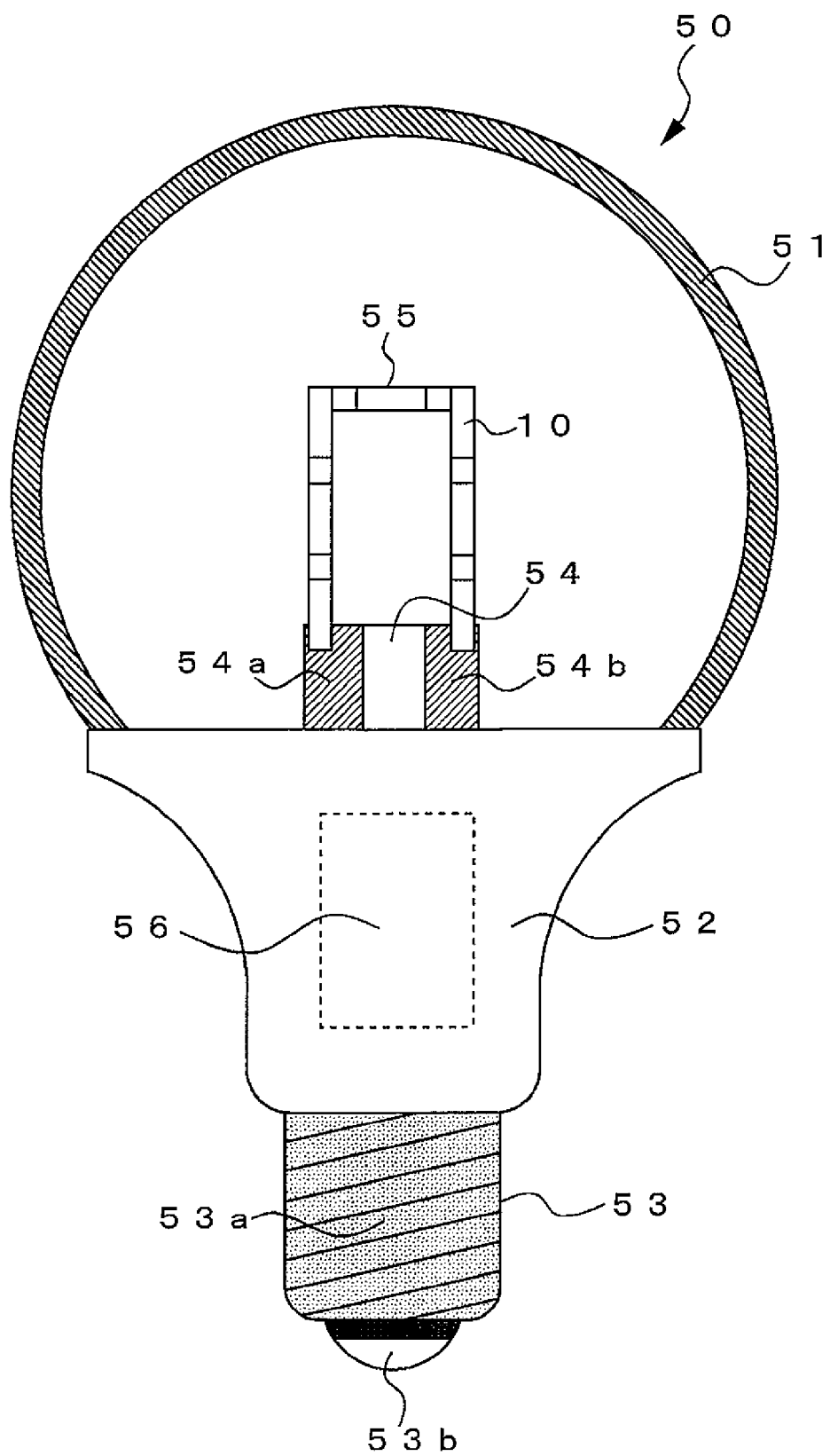
FIG. 11 is a side view of the semiconductor light-emitting device according to the third exemplary embodiment.

Next, a semiconductor light-emitting device of the third exemplary embodiment will be described using FIG. 11. In FIG. 11, the reference sign 50 indicates a semiconductor light-emitting device of the third exemplary embodiment. The semiconductor light-emitting device 50 includes a light-bulb-type housing, a substantially spherical resin cover 51 which seals a LED assembly, a support unit 52 made of insulating material, and a connection unit 53 for inputting electric power from outside. A electrode unit 54 made of an insulating substrate is disposed substantially in the center of the support unit 52, and a pair of electrodes 54a and 54b is formed on the electrode unit 54.

An LED assembly 55 in which the fluorescent LEDs 10 are connected in series in a substantially squared 'U' shape is disposed at an upper portion, on the drawing, of the electrode unit 54. The electrode unit 54 is attached vertically in relation to the support unit 52, so the LED assembly 55 is also supported in the vertical direction along the electrode unit 54.

The semiconductor light-emitting device 50 has a driving unit 56 (indicated by a broken line) which drives the LED assembly 55 inside the support unit 52. A pair of fluorescent LEDs 10 located at both ends of the LED assembly 55 is connected to the electrodes 54a and 54b of the electrode unit 54. The electrodes 54a and 54b are connected to the driving unit 56 by members, not illustrated, and the driving unit 56 is connected to connection terminals 53a and 53b of the connection unit 53. When, for example, AC 100V is supplied from outside to the connection unit 53, the driving unit 56 converts the AC 100V to a predetermined direct-current voltage and supplies a direct-current driving voltage to the LED assembly 55 through the electrode unit 54, causing the LED assembly 55 to light up.

By imparting the connection unit 53 with a structure which is the same as the screw type used for typical incandescent electric lamps (e.g., an E26 socket), the semiconductor light-emitting device 50 can be replaced with incandescent electric lamps. In addition, the resin cover 51 may be transparent or translucent, and the resin may contain a reflecting material or a certain fluorescent material alternatively.

Figure 12:
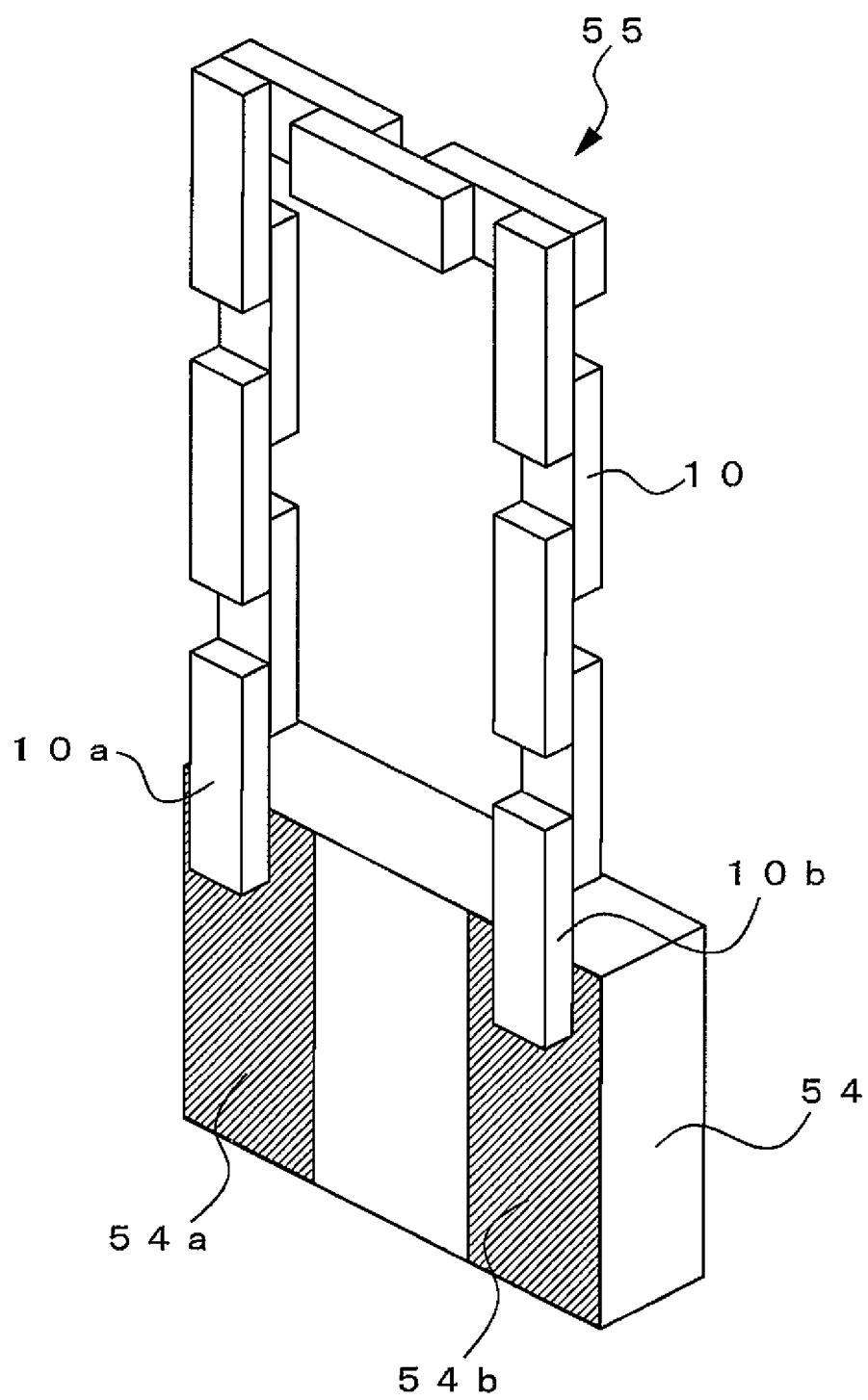
FIG. 12 is a perspective view of the light-emitting element assembly connected in series in a substantially squared 'U' shape inside the semiconductor light-emitting device according to the third exemplary embodiment.

Next, the configuration of the substantially squared 'U'-shaped LED assembly 55 that is incorporated in the semiconductor light-emitting device 50 of the third exemplary embodiment will be described using FIG. 12. In FIG. 12, the LED assembly 55 is an assembly of the fluorescent LEDs 10 which, as described above, are connected in series in a substantially squared 'U' shape. Each of the fluorescent LEDs 10 is the same one as the fluorescent LED 10 illustrated in FIGS. 1A and 1B. As is the case in the first and second exemplary embodiments, each of the fluorescent LEDs 10 which configures the LED assembly 55, is disposed to face neighboring fluorescent LEDs 10, and the external connection electrodes 7 and 8 (see FIGS. 1A and 1B) thereof are electrically and directly connected using solder or the like. Moreover, as illustrated on the drawing, the straight portions of the substantially squared 'U' shape are connected in a straight-line direction, and the corner portions of the substantially squared 'U' shape are connected in a perpendicular direction.

A pair of fluorescent LEDs 10a and 10b located at both ends of the LED assembly 55 are respectively connected to the electrodes 54a and 54b of the electrode unit 54. By supplying the predetermined driving voltage to the electrodes 54a and 54b, a driving current flows to the LED assembly 55, and the individual fluorescent LEDs 10 light up. As is the case in the first exemplary embodiment, by using blue LEDs for the fluorescent LEDs 10, and by letting the fluorescent resin 9 (see FIGS. 1A and 1B) coating the fluorescent LEDs 10 contain a green fluorescent material and a red fluorescent material individually, emitted light with a similar wavelength distribution to that in the first exemplary embodiment (see FIG. 6) can be obtained. In this way, a semiconductor light-emitting device can be realized with excellent color rendering characteristics which emits the blue light B, the green light G, and the red light R in a well-balanced manner.

In addition, as is the case in the second exemplary embodiment, by using blue LEDs for the fluorescent LEDs 10, by letting the fluorescent resin 9 coating the fluorescent LEDs 10 contain a YAG fluorescent material, and by letting the resin cover 51 contain a red fluorescent material, emitted light with a similar wavelength distribution to that in the second exemplary embodiment (see FIG. 9) can be obtained. In addition, since the substantially squared 'U'-shaped LED assembly 55 is supported vertically in relation to the support unit 52, as described above, the emitted light shape (the light source shape) and the spreading of the emitted light resemble those of a filament-type light bulb. Thus, a semiconductor light-emitting device can be provided which has similar light-emitting characteristics as filament-type electric lamps in the present exemplary embodiment.

As stated above, the semiconductor light-emitting device 50 has the fluorescent LEDs 10 incorporated therein as an assembly in which the fluorescent LEDs 10 are connected in series in a substantially squared 'U' shape, and therefore a semiconductor light-emitting device can be realized which is suitable as an energy-saving-type replacement for filament-type electric lamps. Moreover, as a result of the use of the fluorescent LEDs 10, fluorescent resin 9 which contains a variety of fluorescent materials can be arbitrarily selected, so a light-bulb-type light-emitting device which emits light in a variety of colors can be easily manufactured.

The semiconductor light-emitting devices described above have excellent color rendering characteristics and are compact but have high luminance and high output, and thus can be widely utilized in, for example, a variety of illumination light sources and automotive light sources.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A semiconductor light-emitting device comprising:
    a metal plate;
    an insulating substrate which has conduction patterns formed thereon and a through hole, the insulating substrate being laminated on the metal plate; and
    a light-emitting element assembly disposed within the through hole and configured by a plurality of fluorescent semiconductor light-emitting elements each of which has external connection electrodes respectively connected to an n-type semiconductor layer and a p-type semiconductor layer, wherein at least an outer surface other than the external connection electrodes of each of the fluorescent semiconductor light-emitting elements is coated with a resin containing a fluorescent material,
    wherein the light-emitting element assembly is configured such that the external connection electrodes of the fluorescent semiconductor light-emitting elements are directly connected in series using solder,
    in the light-emitting element assembly, the external connection electrodes of neighboring fluorescent semiconductor light-emitting elements are faced toward one another and connected, and thereby the neighboring fluorescent semiconductor light-emitting elements overlap in a depthwise direction, and the plurality of fluorescent semiconductor light-emitting elements are disposed separately into an upper layer and a lower layer,
    the fluorescent semiconductor light-emitting elements of the lower layer are in close contact with the metal plate exposed by the through hole,
    the fluorescent semiconductor light-emitting elements on ends of the light-emitting element assembly are disposed on the upper layer, and
    the external connection electrodes of the fluorescent semiconductor light-emitting elements on the ends are electrically connected to the conduction patterns, and thereby a driving voltage is supplied to the light-emitting element assembly.

2. The semiconductor light-emitting device according to claim 1, wherein, in the light-emitting element assembly, neighboring fluorescent semiconductor light-emitting elements are connected in a straight-line direction or a perpendicular direction.

3. The semiconductor light-emitting device according to claim 1, comprising two or more light-emitting element assemblies, wherein the light-emitting element assemblies are connected in parallel.

4. The semiconductor light-emitting device according to claim 1, wherein the fluorescent material of the fluorescent semiconductor light-emitting elements of the upper layer and the fluorescent material of the fluorescent semiconductor light-emitting elements of the lower layer differ from each other.

5. The semiconductor light-emitting device according to claim 4, wherein the fluorescent material of the fluorescent semiconductor light-emitting elements of the upper layer is a green fluorescent material, and the fluorescent material of the fluorescent semiconductor light-emitting elements of the lower layer is a red fluorescent material.

6. The semiconductor light-emitting device according to claim 1, further comprising a sealing material which is made of resin containing a diffusing agent, the sealing material sealing the light-emitting element assembly.

7. The semiconductor light-emitting device according to claim 1, further comprising a sealing material which is made of resin containing a fluorescent material, the sealing material sealing the light-emitting element assembly.

* * * * *